United States Patent [19]

Milkovic

[11] Patent Number: 4,754,219

[45] Date of Patent: Jun. 28, 1988

[54] LOW COST SELF-CONTAINED TRANSFORMERLESS SOLID STATE ELECTRONIC WATTHOUR METER HAVING THIN FILM FERROMAGNETIC CURRENT SENSOR

[75] Inventor: Miran Milkovic, Scotia, N.Y.

[73] Assignee: General Electric Company, Somersworth, N.H.

[21] Appl. No.: 774,153

[22] Filed: Sep. 9, 1985

[51] Int. Cl.$^4$ .................. G01R 21/06; G01R 1/00; G01R 33/00
[52] U.S. Cl. .................................. 324/142; 324/111; 324/117 R; 324/96; 364/483
[58] Field of Search ................ 324/142, 117 R, 134, 324/111, 252, 96; 364/483

[56] References Cited

U.S. PATENT DOCUMENTS

| | | | |
|---|---|---|---|
| 3,461,384 | 8/1969 | Bayati et al. | 324/96 |
| 3,947,763 | 3/1976 | Milkovic | 324/142 X |
| 3,976,942 | 8/1976 | Mayfield | 324/142 X |
| 4,066,960 | 1/1978 | Milkovic | 324/142 |
| 4,092,592 | 5/1978 | Milkovic | 324/142 |
| 4,296,413 | 10/1981 | Milkovic | 324/62 X |
| 4,414,510 | 11/1983 | Milkovic | 324/252 X |
| 4,437,059 | 3/1984 | Hauptmann | 324/111 |
| 4,464,625 | 8/1984 | Lienhard et al. | 324/117 R |

OTHER PUBLICATIONS

Bowen et al.; "Magnetoresistive Current Sensor"; IBM Technical Disclosure Bulletin; vol. 17, No. 3, Aug. 1974; pp. 728–729.

Primary Examiner—Gerard R. Strecker
Assistant Examiner—Vinh P. Nguyen
Attorney, Agent, or Firm—Robert E. Brunson; Charles W. Helzer

[57] ABSTRACT

A transformerless, self-contained, low cost, small size, light weight solid state electronic watthour meter is described which employs thin film ferromagnetic current sensors of the type which are magnetically coupled to power conductors whose current flow is to be sensed and metered and which provides electrical isolation between the power conductors and the sensing and metering circuitry. The meter is self-contained in that it draws its operating direct current supply potential required to operate the meter directly from the power conductors being metered and does not require a separate battery or transformer coupled direct current power source. The entire meter circuitry, including the thin film ferromagnetic current sensors which can be fabricated by thin film technology and the direct current power supply and the watthour meter circuitry, all are susceptible of fabrication on a single substrate using semiconductor integrated circuit fabrication techniques.

5 Claims, 2 Drawing Sheets

LOW COST SELF-CONTAINED TRANSFORMERLESS SOLID STATE ELECTRONIC WATTHOUR METER HAVING THIN FILM FERROMAGNETIC CURRENT SENSOR

FIELD OF INVENTION

This invention relates to a novel, transformerless, low cost, small size, light weight, self-contained, solid state electronic watthour meter employing thin film ferromagnetic current sensors of the type which are magnetically coupled to power conductors whose current flow is to be sensed and metered and which provides electrical isolation between the power conductors and the sensing and metering circuitry.

More particularly, the invention provides a solid state electronic watthour meter having the above characteristics which is self-contained in that it draws the operating direct current supply potentials required to operate the meter directly from the power conductors being metered and does not require a separate battery or transformer coupled direct current power supply. The entire meter circuitry including the thin film ferromagnetic current sensors, the direct current power supply and the watthour meter circuitry, all are susceptible of fabrication on a single substrate using semiconductor integrated circuit fabrication techniques.

BACKGROUND PRIOR ART

U.S. patent application Ser. No. 506,803, filed June 22, 1983 for "Tranformerless Solid State Electronic Watthour Meter"—Miran Milkovic, inventor and assigned to the General Electric Company, discloses a satisfactory, transformerless solid state electronic KWH meter which employs a low value current sensing resistor together with a load voltage sensing resistor and novel differential amplifier circuit connection to derive required current indicating and voltage indicating input signals to the KWH meter. Because the KWH meter circuit does not require a separate current sensing transformer, it is susceptible to fabrication using solid state semiconductor integrated circuit fabrication techniques. As a result, the meter can be made at relatively low cost and is small and light weight so that it can be mounted on or adjacent to power conductors and/or their insulating support members with suitable easily installed mounting devices and procedures.

While the above-described solid state electronic watthour meter disclosed in the above-noted U.S. patent application Ser. No. 506,803 is satisfactory for many uses, because of its direct connection to the power conductors to be metered via current and voltage limiting impedances, the meter circuit does not provide electrical isolation between the power components being metered and the metering circuit itself. To overcome this problem the present invention was devised.

SUMMARY OF INVENTION

It is therefore a primary object of the invention to provide a novel transformerless, low cost, small size, light weight, self-contained solid state electronic watthour meter employing thin film ferromagnetic current sensors of the type which are magnetically coupled to power conductors whose current flow is to be sensed and metered, and which provides electrical isolation between the power conductor and the sensing and metering circuitry.

More particularly, the invention provides a solid state electronic watthour meter having the characteristics recited in the preceeding paragraph which is self-contained in that it draws operating direct current supply potentials required to operate the meter directly from the power conductors being metered and does not require a separate battery or transformer coupled direct current power supply, and the entire meter circuit including the thin film ferromagnetic current sensors, the direct current power supply circuitry and the watthour meter circuitry all are susceptible of fabrication on a single substrate using semiconductor integrated circuit fabrication techniques.

In practicing the invention a low cost, light weight, small size, self-contained transformerless solid state electronic watthour meter is provided for deriving electric output signals representative of the electric power being supplied to a load through power supply conductors. The meter is comprised by a low cost, light weight, small size, thin film ferromagnetic current sensing device adapted to be physically mounted adjacent to the power supply conductors in magnetically coupled relation for sensing the magnitude of electric current flow through the power conductors and deriving an analog current indicating signal representative of the current and voltage supplied through the power conductors. Voltage sensing means in the form of a voltage divider is coupled across the load supplied by the power supply conductors and derives an analog voltage indicating signal representative of the magnitude of the load voltage. Multiplier circuit means are provided which are responsive to the current indicating signal and the voltage indicating signal for multiplying the two signals together and deriving a pulse-width modulated/amplitude modulated product signal representative of the power being supplied to the load. This product signal is supplied to an integrator/comparator circuit means for converting the product signal to an output varible pulse rate signal each pulse of which is representative of a finite quantity of electric energy and the variable pulse rate is indicative of the power being consumed.

In the above-described watthour meter, the meter is self-contained in that it further includes direct current operating power supply circuit means which directly derives direct current operating power from the power supply conductors without requiring a separate direct current power supply transformer (or battery) and the entire meter circuit including the direct current power supply is susceptible to fabrication using semiconductor solid state integrated circuit fabrication techniques.

The low cost, light weight, small size ferromagnetic current sensing device employed in the watthour meter preferably comprises a thin film magnetoresistive magnetic field sensor formed by semiconductor integrated circuit fabrication techniques on a common substrate with other components of the solid state meter circuit. The thin film magnetoresistive magnetic field sensing device preferably is fabricated in the form of a balanced Wheatstone bridge with each arm of the bridge comprising a magnetoresistive magnetic field sensor wherein each field sensor is magnetically coupled to the power supply conductor to be measured. In this arrangement, the two diagonally opposite terminals of the bridge are connected across the input and output terminals of a constant current output amplifier supplied with an input supply current and the two remaining diagonally opposite terminals of the bridge are connected across a set of current indicating input terminals to the multiplier circuit means of the watthour meter.

In a preferred embodiment of the invention the watthour meter circuit includes automatic error correction circuit means for feeding back an automatic error correcting polarity reversing signal from the output thereof to the input of the multiplier circuit means for reversing the polarity of one of the input signals to the input of the multiplier circuit means whereby long term errors due to drift, thermal changes and the like are averaged out of the product signal being derived by the multiplier circuit means during each quantizing period operation of the meter.

Another feature of the invention is the provision of output signal isolation coupling circuit means for providing electrical isolation between the output from the integrator/comparator circuit means of the watthour meter and the input to local and/or remote register and display means for use by the consumer and/or a remote central office operated in conjunction with a microprocessor for use in power demand monitoring and revenue billing purposes. The provision of the output signal isolation coupling circuit which preferably is in the form of a laser and optically coupled light detector excited by the pulsed output signal from the integrator comparator circuit means. The light detector output then is supplied to the local and/or central office register and display means and microprocessor.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference character, and wherein.

BEST MODE OF PRACTICING THE INVENTION

Figure 1:
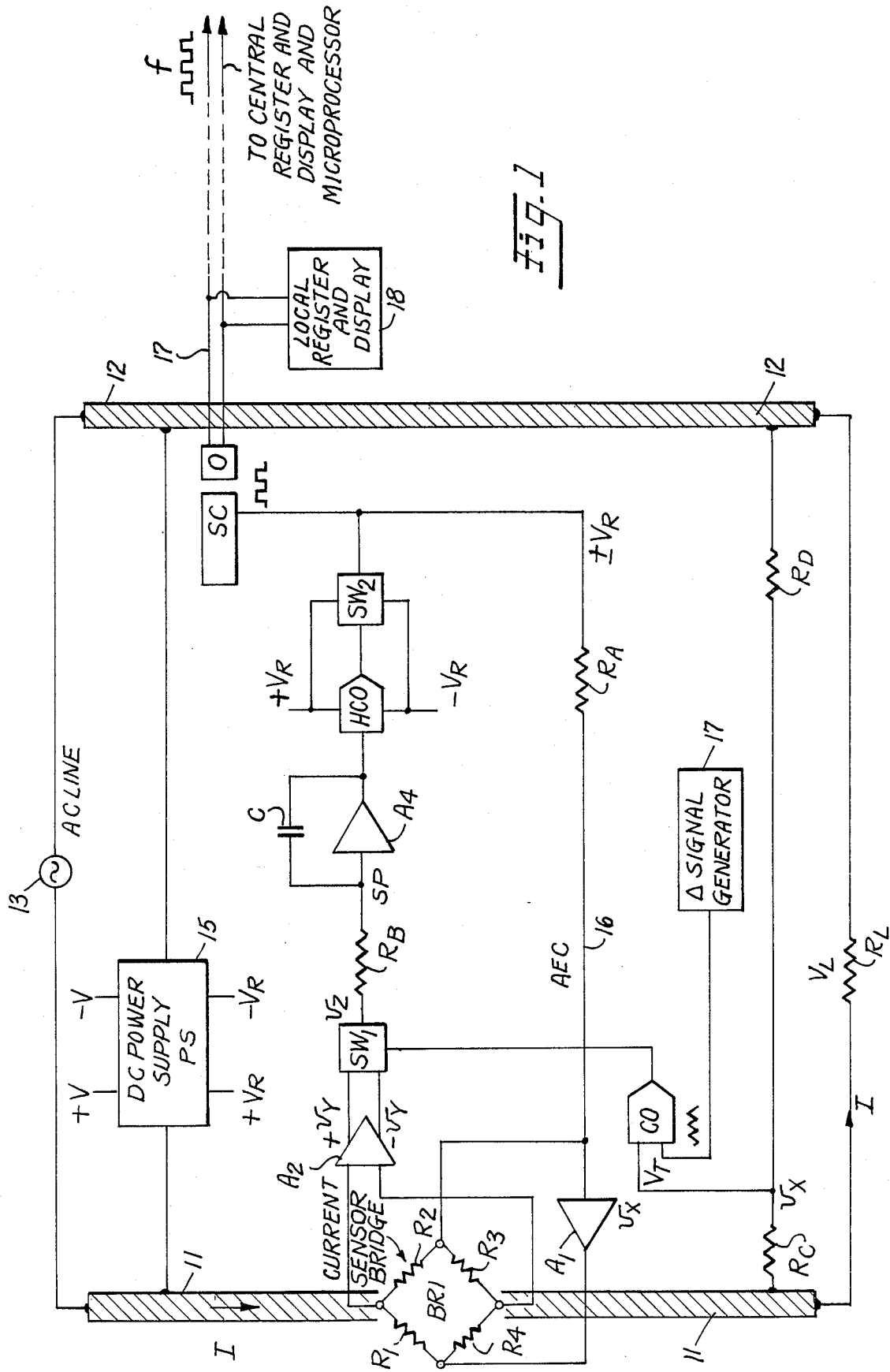
FIG. 1 is a functional, schematic block diagram illustrating an embodiment of the invention constructed for use in a single phase alternating current power system.

FIG. 1 is a schematic functional block diagram a preferred embodiment of the invention for use in measuring power supplied across single phase power conductors such as shown at 11 and 12. In FIG. 1 power conductors 11 and 12 have been illustrated as enlarged in order to better depict the manner in which they are magnetically coupled to a current sensor bridge BR1 constructed according to the invention and to be described more fully hereafter. The power conductors 11 or 12 are supplied from an alternating current source of power 13 and are connected across a suitable load RL for supplying the load with electric power to be measured by the solid state watthour meter comprising the invention.

The solid state electronic watthour meter shown in FIG. 1 is transformerless, low cost, small size, light weight and self-contained for reasons which will become apparent from the following description. The meter is designed such that it does not require a normally-used current transformer which would need a ferromagnetic core member and both input and output windings and is heavy, bulky and not subject to fabrication by integrated circuit manufacturing techniques. Thus, those meters requiring transformer-type current sensors are generally bulkier, heavier and more expensive than a meter constructed according to the invention.

The current sensor bridge BR1 preferably comprises a thin film ferromagnetic bridge formed by thin film magnetoresistive sensor elements R1, R2, R3 and R4 connected in a Wheatstone bridge arrangement and physically disposed so that the electromagnetic field produced by the current flowing in conductor 11 is magnetically coupled to all of the magnetoresistive sensor elements R1 through R4 comprising current sensor bridge BR1. The current sensor bridge may utilize thin film ferrite magnetoresistive sensors of the type described in U.S. Pat. No. 4,414,510, issued Nov. 8, 1983 and entitled "Low Cost Sensing System and Method Employing Anistropic Magneto-Resistive Ferrite Member"—Miran Milkovic, inventor, assigned to the General Electric Company. Alternatively, the current sensor bridge BR1 could employ magnetoresistive permalloy current sensor elements of the type described in a publication entitled "A Permalloy Current Sensor" by C. H. Bajorek, et al and reported in the IEEE Transactions on Magnetics in Volumne Magnetics 12, no. 6, Nov. 1976 on pages 813-815. Other comparable magnetic sensitive current sensors also are available which could be used as the current sensing bridge BR1 in place of the normally employed current transformer used in known prior art solid state electronic watthour meters.

For a detailed description of the current sensor bridge BR1, reference is made to the above-noted prior art U.S. Pat. No. 4,414,510 describing a thin film ferrite current sensor and/or the IEEE Transactions article describing a thin film permalloy current sensor. Each of these devices are susceptible to fabrication using solid state semiconductor integrated circuit fabrication techniques wherein the sensor devices are formed on a common insulating substrate which also can be used to support the remaining elements of the watthour meter circuit including the DC power supply for the meter shown schematically at 15. Briefly, however, it can be stated that the current sensor bridge BR1 is designed so that the magnetoresistive sensor elements R1-R4 are physically mounted in juxtaposition to the current conductor 11 in a manner such that the magnetic field induced by current flow in conductor 11 permeates the magnetic resistive sensor elements R1-R4. This creates an unbalanced condition in the bridge BR1 with the degree of unbalance being in proportion to the strength of the induced magnetic field which in turn is proportional to the current I flowing in the power conductor 11. The unbalanced condition thus induced in bridge BR1 produces an output current indicating signal flow across a set of diagonally opposite terminals of the bridge BR1 which is connected as an input circuit to an operational amplifier A2 of conventional, commercially available integrated circuit construction. The remaining set of diagonally opposite terminals of bridge BR1 is connected across the input and output of a constant current source operational amplifier A1 whose input also is supplied with a source current fed back across feedback conductor 16 as will be described more fully hereafter.

The current indicating signals derived from the output terminals of the sensor bridge BR1 are proportionally amplified in amplifier A2. Amplifier A2 derives at its output two proportionally amplified, amplitude modulated current indicating signals + and −vy which are applied to respective current indicating signal input terminals of a solid state electronic multiplier switch SW1. Multiplier switch SW1 is of the type desribed in prior art U.S. Pat. No. 3,947,763 issued Mar. 30, 1976 for a "CMOS Electronic KWH Meter and Method for Metering Electrical Energy"—Miran Milkovic, inventor and assigned to the General Electric Company, the disclosure of which hereby is incorporated into this application. Multiplier switch SW1 in addition to the current indicating input signals has supplied thereto a voltage indicating signal derived from a voltage dividing bridge formed by two resistors RC and RD connected in series circuit relationship across the load RL and with which a voltage indicating signal vx is obtained from the juncture of the voltage dividing resistors RC and RD. Voltage indicating signal vx is supplied to a comparator CO in conjunction with a high frequency triangular waveshape signal VT supplied from a triangular waveshape signal generator 17, and which derives at its output a pulse-width modulated voltage indicating signal that is supplied as a further input to the multiplier switch SW1.

For a more detailed description of the operation of the multiplier switch SW1, reference is made to the above-noted prior art U.S. Pat. No. 3,947,763. Briefly, however, it can be stated that the multiplier switch SW1 serves to multiply the amplitude modulated current indicating input signal either +vy of −vy with the pulse width modulated voltage indicating input signal vx and to derive at its output a pulse-width modulated-/amplitude modulated product signal vz representative of the power being supplied to the load through the power conductors 11 and 12.

The pulse-width modulated/amplitude modulated product signal vz appearing at the output of the multiplier switch SW1 is supplied to the input of an integrator circuit comprised by an input resistor RB, feedback operational amplifier A4 and feedback capacitor C which integrates the relatively high frequency, pulse-width modulated/amplitude modulated pulsed product signal vz appearing at the output of the multiplier switch SW1 and converts it to an analog signal. The analog signal appearing at the output of the integrator RB, A4 and C then is supplied to the input of an analog-to-pulse rate converter comprised by a comparator circuit HCO supplied with alternate polarity input reference voltages +VR and −VR and whose output is supplied to a bistable multivibrator comprised by a second semiconductor switch circuit SW2. The construction and operation of the analog-to-pulse rate converter HCO and SW2 is described more fully in the above-referenced U.S. Pat. No. 3,947,763. Briefly, however, it can be stated that the circuit, alternately, integrates the analog output from RB, A4 and C down to the value of the reference voltage −VR and then up to the reference voltage +VR so as to provide at the output from the multivibrator SW2 a variable pulse rate output signal wherein each pulse represents a finite, known quantity of electric energy. The pulse rate of this output signal varies in accordance with the kilowatt hours being consumed over any given interval of time, and therefore provides a measure of the kilowatt hours of electrical energy being supplied to load RL through power supply conductors 11, 12.

In order to eliminate or substantially reduce long term errors introduced into the watthour meter reading to a minimum, automatic error correction circuit means are provided wherein the output variable rate, alternate polarity unit energy pulse train appearing at the output of the analog-to-pulse rate converter switch SW2 shown as + and −VR is fed back over a feedback resistor RA via conductor 16 to the input of constant current feedback amplifier A1 as a source of input current to the constant current feedback amplifier A1 supplying the current sensor bridge BR1. From this circuit arrangement, it will be appreciated that the constant current input to the current sensor bridge BR1 from feedback amplifier A1 alternately is reversed in polarity during each half cycle of a quantizing period of operation of the meter circuit. Consequently, the current indicating input signal supplied to the first multiplier switch SW1 alternates in polarity from +vy to −vy over each half cycle of quantizing period of operation of the metering circuit. As a result, the integrator RV, A4, C alternately integrates the product signal + and −vz up and down to the known reference voltage levels + and −VR in a manner which appropriately adds the pulse-width modulated/amplitude modulated product components of the signal over a full quantizing period of operation of the meter. Operation in this manner, however, results in subtracting out long term offset errors due to thermal drift and the like which build up in the circuit during each alternate half cycle of operation so as to in effect cancel out such offset errors over a full quantizing period of operation of the meter circuit. For a more detailed description and explanation of the operation of the automatic error correction circuit feature, reference is made to U.S. Pat. No. 4,066,960 issued Jan. 3, 1978 for "Electronic Kilowatt-Hour-Meter With Error Correction"—Miran Milkovic, inventor and assigned to the General Electric Conpany.

A somewhat similar automatic offset error correction circuit arrangement also is disclosed in prior art U.S. Pat. No. 4,296,413 issued Oct. 20, 1981 for a "Resistance-Bridge Frequency Converter With Automatic Offset Correction"—Miran Milkovic, inventor and assigned to the General Electric Company. In U.S. Pat. No. 4,296,413, the automatic error correction circuitry is employed only in connection with a bridge circuit amplifier output arrangement for correction of long term offset errors and not in conjunction with a kilowatt hour meter using multiplier circuits for multiplying together two differenct signals such as the voltage indicating signal and current indicating signal employed in the present invention.

The variable rate, quantized, pulsed output signal appearing at the output from the analog to pulse rate converter HCO, SW2 also is supplied through an output signal isolation coupling circuit means shown at SC and D in FIG. 1. The output signal isolation coupling circuit means SC may comprise a solid state semiconductor laser, for example, which is light coupled to a photosensitive detector D whose electrical output signal then is supplied over an output cable 17 to a local register and display 18 for readout at the customer's premises. The quantized variable frequency pulse train signal supplied from photodetector D also may be supplied by a suitable conductor, radio transmission, optical transmission over fiber-optic cable, or the like, to a central register and display (not shown) where it can be applied to a microprocessor for analysis and use in electrical demand monitoring and custormer billing. For suitable disclosures of systems which provide automatic meter reading and billing as described briefly above from a central office, reference is made to U.S. Pat. No. 4,465,970—issued Aug. 4, 1984 for "Method and Apparatus for Multiple Rate Metering of Electrical Energy"—Donald V. DiMassimo, et al—inventors, and assigned to the General Electric Company.

While the preferred form of isolation signal coupling output circuit comprises a laser device and light-coupled detector combination which presently are commercially available in prepackaged form on the market, other types of isolation providing output circuits can be used even including, if feasible for a particular installation, small signal coupling transformers whose size, weight and cost make their use in the present system economically justifiable for the particular application.

Figure 2:
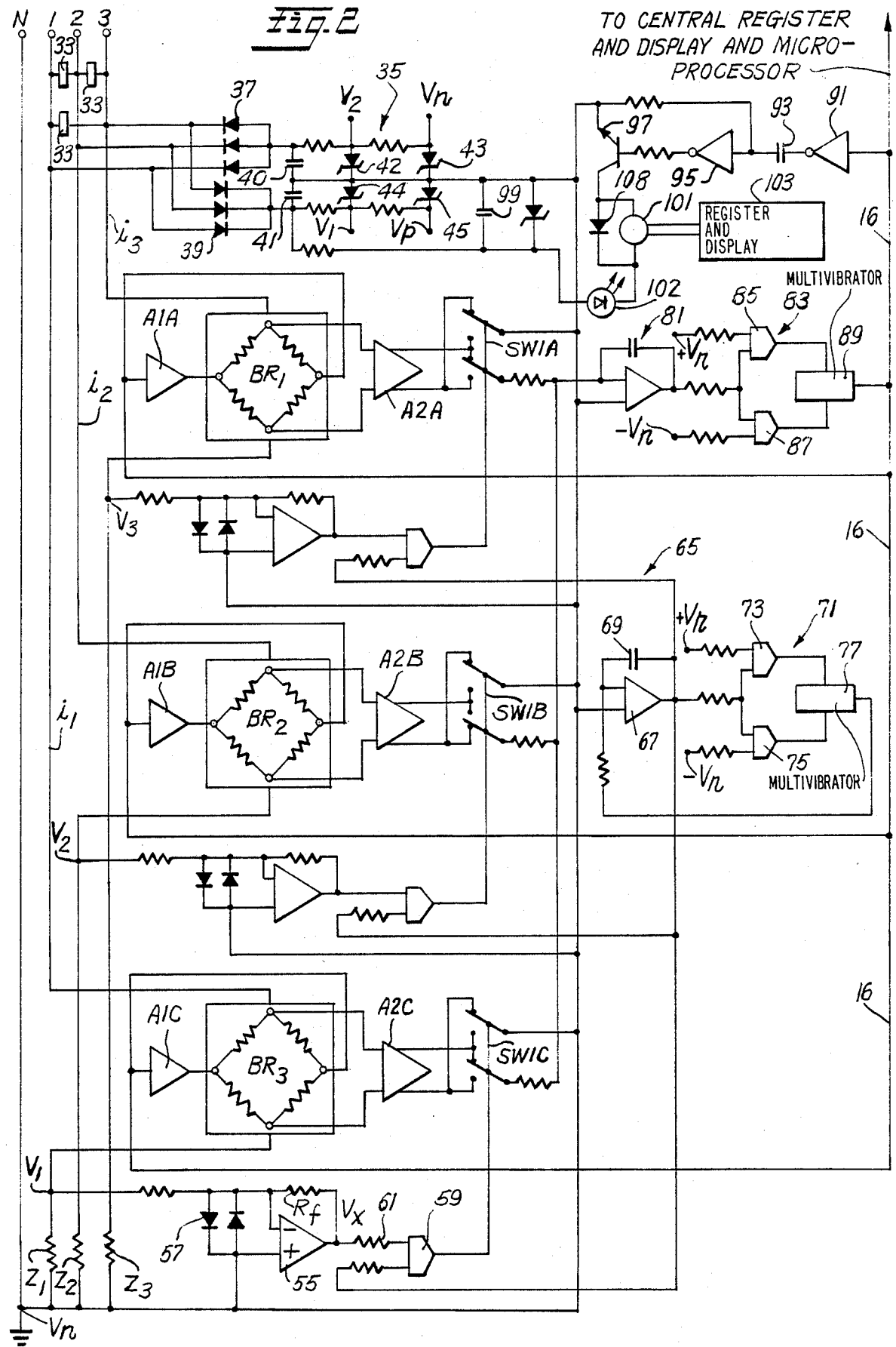
FIG. 2 is a more detailed circuit diagram of a multiphase solid state watthour meter constructed according to the invention.

The solid state electronic watthour meter shown in FIG. 1 is self-contained in that the meter includes direct current operating power supply circuit means 15 which directly derives direct current operating power + and −V and + and −VR from the power supply conductors 11 and 12 to which it is directly connected by means of a diode rectifier and filter capacitor network of the type shown at 35 in FIG. 2 of the drawings. As shown in FIG. 2, the direct current power supply shown at 35 is comprised by rectifiers 37, 39; capacitors 40, 41; resistors (not numbered), zener diodes 42–45; capacitor 99 and its associated zener diode, all of which are susceptible to fabrication using solid state semiconductor integrated circuit manufacturing techniques. For a more detailed description of the construction and operation of the DC power supply 15 in FIG. 1 and 35 in FIG. 2, reference is made to U.S. Pat. No. 4,092,592 issued May 30, 1974 for an "Electronic KWH Meter Having Virtual Ground Isolation"—Miran Milkovic, inventor and assigned to the General Electric Company.

It is because the self-contained, self-excited DC power supply 15 is directly connected across the power supply conductors 11 and 12, that an isolation type of output coupling circuit SC-D is utilized in the watthour meter comprising the present invention. By the provision of this second isolation feature, it is assured that no power level current voltages can leak or otherwise find their way into consumer or central office personnel utilized components of a metering system employing the invention.

FIG. 2 illustrates a multiphase embodiment of a novel solid state electronic watthour meter constructed according to the invention wherein similar components have been identified by the same reference character, but have been provided with suitable additional letters A, B or C to identify the components associated with the third phase 3, the second phase 2 and phase 1 wherein the load for phase 1 is shown at Z1, the load for phase 2 is shown at Z2 and the load for phase 3 is shown at Z3. In this arrangement third phase load current i3 supplied through phase conductor 3 is sensed by sensor bridge BR1 supplied from constant current amplifier A1A and whose output is supplied through operational amplifier A2A to the current indicating input terminals of multiplier switch SW1A. Similarly, the load current i2 supplied to phase conductor 2 is sensed by sensor bridge BR2 supplied from constant current amplifier A1B and whose output is supplied through operational amplifier A2B to the current input terminals of multiplier switch SW1B. Load current i1 supplied through phase conductor 1 is sensed by sensor bridge BR3 supplied from constant current amplifier A1C and whose output is supplied through operational amplifier A2C to the third multiplier switch SW1C. The current sensor bridges BR1, BR2 and BR3 are similar in construction and operation to the thin film sensor bridge BR1 in FIG. 1.

The voltage indicating signal supplied to each of the multipliers SW1A, SW1B and SW1C is obtained across the load impedance Z1 and supplied through operational amplifier 55 to a pulse-width modulator comprised by a comparator 59 which also has supplied to it a triangular output signal developed by a triangular signal generator 71. Comparator 59 supplies its pulse-width modulated voltage indicating signal to multiplier switch SW1C in conjunction with the alternate polarity current indicating signals supplied to the current indicating signal input terminals of switch SW1C from the output of input operational amplifier A2C. In a similar manner, the multiplier switches SW1B and SW1A are provided with voltage indicating signals and corresponding components having their inputs coupled across the load impedances Z2 and Z3, respectively.

The pulse-width modulated/amplitude modulated product signals vz developed by all of the phase multipliers SW1A, SW1B and SW1C are summed together in summing resistors which are connected in common to the input of an integrator feedback amplifier 81 and serve as the input resistors to the integrator. The integrator 81 output is supplied to the analog-to-pulse rate converter comprised by the comparators 85 and 87 and multivibrator circuit 83 with the multivibrator 89 supplying its variable pulse rate output to a common AEC feedback conductor 16. Conductor 16 feeds back automatic error correcting polarity reversing signals to the inputs of the respective constant current amplifiers A1A, A1B, A1C in the same manner described with relation to the single phase circuit shown in FIG. 1.

In operation, the multiphase circuit of FIG. 2 functions similar to the single phase circuit of FIG. 1 in each of the phases and supplies each phase output to a respective summing resistor where it is summed with the outputs from the other phases and applied to the integrator analog-to-pulse rate converter circuits 81 and 83. The resultant variable rate, quantized pulse output signal derived from the analog-to-pulse rate converter 80 then may be applied to a local register and display 103 as described more fully in U.S. Pat. No. 4,092,592, issued May 30, 1978 entitled "Electronic KWH Meter Having Virtual Ground Isolation"—Miran Milkovic, inventor and assigned to the General Electric Company, the disclosure of which is hereby incorporated into the disclosure of this application in its entirety. It should be noted that because of its nature, the register and display 103 employed in FIG. 2 provides isolation between the register and display and the output from the analog-to-pulse rate converter 89. In addition to the local register and display 103, remote central office readout through a suitable isolation providing signal coupling device similar to the elements SC and D shown in FIG. 1, can be provided.

In addition to the above features, it should be noted that voltage limiting, metal oxide varistors 33 are connected across each of the phases 1, 2 and 3 in the manner shown in FIG. 2 so as to limit any voltage spikes or current surges across the power supply conductors 1, 2 and 3 to the ratings of the varistors 33. Since the metal oxide varistors 33 are of a known commercially available type, further description of these devices is believed unnecessary.

INDUSTRIAL APPLICATION

From the foregoing description it will be appreciated that the invention provides a novel transformerless, self-contained, low cost, small size, light weight solid state electronic watthour meter employing a low cost, small size, light weight thin film ferromagnetic current sensor of the type which are magnetically coupled to power conductors whose current flow is to be sensed and metered and which provides electrical isolation between the power conductor and the sensing and metering circuitry.

Having described a novel low cost, self-contained, transformerless, solid state electronic watthour meter having thin film ferromagnetic current sensors constructed according to the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A low cost, light weight, small size self-contained transformerless solid state electronic watthour meter fabricated in semiconductor integrated circuit structure form for deriving electric output signals representative of the electric power being supplied through power supply conductors, said meter comprising a low cost, light weight, small size thin film ferromagnetic integrated circuit type current sensing device for mounting adjacent to the power supply conductors by suitable securement means in magnetically coupled relation for sensing the magnitude of electric current flow through the power conductors and deriving a current indicating signal representative thereof, voltage sensing means coupled across a load supplied by the power supply conductors and deriving a voltage indicating signal representative of the magntidue of the load voltage, multiplier circuit means responsive to the current indicating signal and the voltage indicating signal for multiplying the current and voltage indicating signals together and deriving a pulse-width modulated and amplitude modulated product signal representative of the power being supplied to the load, integrator and comparator circuit means responsive to the pulse-width modulated and amplitude modulated product signal for converting the product signal to an output variable pulse rate signal each pulse of which is representative of a known finite quantity of electric energy, the thin film ferromagnetic current sensing device comprises a balanced Wheatstone bridge with each arm of the bridge comprising a thin film magnetoresistive magnetic field sensor and each field sensor being mounted for magnetic coupling to the power supply conductor to be measured, and with two diagonally opposite terminals of the bridge being connected across the input and output terminals of a constant current amplifier supplied with an input supply current and the two remaining diagonally opposite terminals of the bridge being connected across a set of current indicating input terminals to the multiplier circuit means and wherein the meter circuit further includes automatic error correction circuit means for feeding back an automatic error correcting polarity reversing signal from the output thereof to the input of the multiplier circuit means for alternately reversing the polarity of one of the input signals to the input of the multiplier circuit means whereby long term errors due to drift and thermal changes are averaged out of the product signal derived by the multiplier circuit means during each quantizing period of operation of the meter and wherein the automatic error correction circuit means automatically feeds back the error correcting, polarity reversing feedback signal to the input of the constant current amplifier as the supply current thereto for supplying the two diagonally oppposite terminals of the magnetic field sensor bridge with a constant current excitation signal of opposite polarity during each half cycle of a quantizing period of operation of the meter.

2. A low cost, light weight, small size self-contained transformerless solid state electronic watthour meter fabricated in semiconductor integrated circuit structure form for deriving electric output signals representative of the electric power being supplied through power supply conductors, said meter comprising a low cost, light weight, small size thin film ferromagnetic integrated circuit type current sensing device for mounting adjacent to the power supply conductors by suitable securement means in magnetically coupled relation for sensing the magnitude of electric current flow through the power conductors and deriving a current indicating signal representative thereof, voltage sensing means coupled across a load supplied by the power supply conductors and deriving a voltage indicating signals representative of the magnitude of the load voltage, multiplier circuit means responsive to the current indicating signal and the voltage indicating signal for multiplying the current and voltage indicating signals together and deriving a pulse-width modulated and amplitude modulated product signal representative of the power being supplied to the load, integrator and comparator circuit means responsive to the pulse-width modulated and amplitude modulated product signal for converting the product signal to an output variable pulse rate signal each pulse of which is representative of a known finite quantity of electric energy, the low cost, light weight, small size ferromagnetic current sensing device comprises a thin film magnetoresistive magnetic field sensor formed by semiconductor integrated circuit fabrication techniques on a common substrate with the other components of the solid state meter circuit with the substrate being designed for physical mounting in a magnetically coupled manner to the power supply conductors to be measured, the thin film magnetoresistive magnetic field sensor comprises a balanced Wheatstone bridge with each arm of the bridge comprising a thin film magnetoresistive magnetic field sensor and each field sensor being mounted for magnetic coupling to the power supply conductor to be measured, and with two diagonally opposite terminals of the bridge being connected across the input and output terminals of a constant current amplifier supplied with an input supply current and the two remaining diagonally opposite terminals of the bridge being connected across a set of current indicating input terminals of the multiplier circuit means, the meter circuit further includes automatic error correction circuit means for feeding back an automatic error correcting polarity reversing signal from the output thereof to the input of the multiplier circuit means for alternately reversing the polarity of one of the input signals to the input of the multiplier cirucit means whereby long term errors due to drift and thermal changes are averaged out of the product signal derived by the multiplier circuit means during each quantizing period of operation of the meter and wherein the automatic error correction circuit means automatically feeds back the error correcting, polarity reversing feedback signal to the input of the constant current amplifier as the supply current thereto for supplying the two diagonally opposite terminals of the magnetic field sensor bridge with a constant current excitation signal of opposite polarity during each half cycle of a quantizing period of operation of the meter.

3. A self-contained transformerless solid state electronic watthour meter according to claim 2 wherein the output variable pulse rate signal derived from the output of the integrator and comparator circuit means is supplied through output signal isolation coupling circuit means to local register and display means for use by the consumer and remote central office register and display means operated in conjunction with a microprocessor for use in power demand monitoring and revenue billing purposes.

4. A self-contained transformerless solid state electronic watthour meter according to claim 3 wherein the output signal isolation coupling circuit means is comprised by a solid state laser optically coupled to a light detector whose output then is supplied to the local and central office register and display means and microprocessor.

5. A self-contained transformerless solid state electronic watthour meter according to claim 4 further including metal oxide varistor voltate limiting protective means coupled in circuit relationship across the power supply conductors in advance of the watthour meter, and wherein the transformerless watthour meter is self-contained in that it further includes direct current operating power supply circuit means which directly derives direct current operating power from the power supply conductors without requiring a separate direct current power supply transformer and the entire meter circuit including the direct current power supply is susceptible to fabrication using semiconductor solid state integrated circuit fabrication techniques.

* * * * *